United States Patent
Chen et al.

(10) Patent No.: US 6,777,302 B1
(45) Date of Patent: Aug. 17, 2004

(54) NITRIDE PEDESTAL FOR RAISED EXTRINSIC BASE HBT PROCESS

(75) Inventors: Huajie Chen, Wappingers Falls, NY (US); David Angell, Poughkeepsie, NY (US); Seshadri Subbanna, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/250,100

(22) Filed: Jun. 4, 2003

(51) Int. Cl.[7] .............................................. H01L 21/331
(52) U.S. Cl. ....................... 438/335; 438/315; 438/320; 438/321; 438/312; 438/370; 438/374
(58) Field of Search ................................. 438/335, 207, 438/312, 315, 320, 321, 309, 374, 689, 370, 341, 367

(56) References Cited

U.S. PATENT DOCUMENTS

| | | | |
|---|---|---|---|
| 5,015,594 A | * | 5/1991 | Chu et al. .................... 438/207 |
| 5,106,767 A | | 4/1992 | Comfort et al. |
| 5,523,606 A | | 6/1996 | Yamazaki |
| 5,620,908 A | | 4/1997 | Inoh et al. |
| 5,821,149 A | * | 10/1998 | Schuppen et al. .......... 438/312 |
| 6,251,738 B1 | | 6/2001 | Huang |
| 6,492,238 B1 | | 12/2002 | Ahlgren et al. |

* cited by examiner

*Primary Examiner*—Matthew Smith
*Assistant Examiner*—Igwe U. Anya
(74) *Attorney, Agent, or Firm*—Scully, Scott, Murphy & Presser; Joseph P. Abate, Esq.

(57) ABSTRACT

A method of fabricating a high-performance, raised extrinsic base HBT having a narrow emitter width is provided. In accordance with the method, a patterned nitride pedestal region and inner spacers are employed to reduce the width of an emitter opening. The reduced width is achieved without the need of using advanced lithographic tools and/or advanced photomasks.

20 Claims, 4 Drawing Sheets

NITRIDE PEDESTAL FOR RAISED EXTRINSIC BASE HBT PROCESS

BACKGROUND OF INVENTION

The present invention relates generally to a bipolar transistor and, more particularly, to a method for forming a bipolar transistor with a raised extrinsic base using a nitride pedestal and inner spacers to reduce emitter dimension, i.e., width.

Bipolar transistors are electronic devices with two p-n junctions that are in close proximity to each other. A typical bipolar transistor has three device regions: an emitter, a collector, and a base disposed between the emitter and the collector. If the emitter and collector are doped n-type and the base is doped p-type, the device is an "npn" transistor. Alternatively, if the opposite doping configuration is used, the device is a "pnp" transistor. Because the mobility of minority carriers, i.e., electrons, in the base region of npn transistors is higher than that of holes in the base of pnp transistors, higher-frequency operation and higher-speed performances can be obtained with npn transistor devices. Therefore, npn transistors comprise the majority of bipolar transistors used to build integrated circuits.

As the vertical dimensions of the bipolar transistor are scaled more and more, serious device operational limitations have been encountered. One actively studied approach to overcome these limitations is to build transistors with emitter materials whose band gaps are larger than the band gaps of the material used in the base. Such structures are called heterojunction transistors.

Heterojunction bipolar transistors (HBTs) in which the emitter is formed of silicon (Si) and the base of a silicon-germanium (SiGe) alloy have recently been developed. The SiGe alloy (often expressed simply as silicon-germanium) is narrower in band gap than silicon.

The advanced silicon-germanium bipolar and complementary metal oxide semiconductor (BiCMOS) technology use a SiGe base in the heterojunction bipolar transistor. In the high-frequency (such as multi-GHz) regime, conventional compound semiconductors such as GaAs and InP currently dominate the market for high-speed wired and wireless communications. SiGe BiCMOS promises not only a comparable performance to GaAs in devices such as power amplifiers, but also a substantial cost reduction due to the use of standard Si IC fabrication processes and the integration of heterojunction bipolar transistors with standard CMOS.

Improving performance of HBTs involves reduction of carrier transmit time through the transistor and reduction of parasitics such as base resistance and collector-base capacitance. For high-performance HBT fabrication, yielding SiGe/Si HBTs, a conventional way to reduce the base resistance is through ion implantation into the extrinsic base. The ion implantation will cause damage, however, to regions that are in close proximity to the base region. Such damage induced base dopant diffusion and large parasitic capacitance associated with an implanted extrinsic base may ultimately lead to degradation in device performance.

To avoid implantation damage as well as large parasitic capacitance, a raised extrinsic base (Rext) is typically formed by depositing an extra layer of polycrystalline or single crystalline silicon (or SiGe) atop the conventional SiGe extrinsic base layer. There are essentially two processes that may be utilized to achieve such a raised extrinsic base. The first process involves selective epitaxy; the other involves chemical-mechanical polishing (CMP).

In a typical selective epitaxy process, the raised extrinsic base polycrystalline silicon is formed before the deposition of the intrinsic base SiGe. The intrinsic base SiGe is deposited selectively onto the exposed surface of silicon and polycrystalline silicon inside an over-hanging cavity structure. The selective epitaxy with a cavity structure mandates stringent process requirements for good selectivity, and suffers from poor process control. U.S. Pat. No. 5,523,606 to Yamazaki and U.S. Pat. No. 5,620,908 to Inoh, et al. are some examples of prior art selective epitaxy processes.

As mentioned above, CMP can be applied to form a raised extrinsic base. U.S. Pat. No. 5,015,594 to Chu et al. discloses the formation of extrinsic base polysilicon by CMP. The isolation, which is achieved by thermal oxidation, is not feasible in high performance devices due to the high temperature thermal process.

U.S. Pat. No. 6,492,238 to Ahlgren, et al. provides a self-aligned process for forming a bipolar transistor with a raised extrinsic base, an emitter, and a collector integrated with a complementary metal oxide semiconductor (CMOS) circuit with a gate. An intermediate semiconductor structure is provided having a CMOS area and a bipolar area. An intrinsic base layer is provided in the bipolar area. A base oxide is formed across, and a sacrificial emitter stack of silicon layer is deposited on both the CMOS and bipolar areas. A photoresist is applied to protect the bipolar area and the structure is etched to remove the emitter stack silicon layer from the CMOS area only such that the top surface of the emitter stack silicon layer on the bipolar area is substantially flush with the top surface of the CMOS area. Finally, a polish stop layer is deposited having a substantially flat top surface across both the CMOS and bipolar areas suitable for subsequent chemical-mechanical polishing (CMP).

Self-aligned processes such as the one disclosed in the "238 patent minimize the distance between the extrinsic base and the intrinsic base. Reduction of intrinsic base sheet resistance helps to reduce the total base resistance, but there is a trade off between low base sheet resistance and long carrier base transit time. To further lower the base resistance, one can also decrease the emitter width, which functions to reduce the intrinsic base resistance. However, forming ultra-narrow emitters usually requires advanced lithographic tools or advanced photomasks such as phase shift masks, which significantly increases the overall cost of fabricating high-performance raised extrinsic base HBTs.

In view of the drawbacks mentioned above with fabricating high-performance HBTs having reduced carrier transit time, there is a need for providing a method of fabricating a HBT having a raised extrinsic base and a narrow emitter dimension, i.e., width.

SUMMARY OF INVENTION

One object of the present invention is to provide a simple, yet reliable method of fabricating a high-performance HBT.

A further object of the present invention is to provide a method of fabricating a high-speed and high-performance HBT having a raised extrinsic base.

A yet further object of the present invention is to provide a method of fabricating a HBT having a narrow emitter dimension, i.e., width, in which advanced lithographic tools and/or advanced photomasks are not required.

These and other objects and advantages are achieved in the present invention by providing and utilizing a nitride pedestal in a self-aligned process in which inner spacers are employed to reduce the area for fabricating an emitter. In the present method, outer spacers are not employed to separate the polysilicon in the emitter pedestal from the raised extrinsic base. Thus, the method of the present invention can effectively reduce the final emitter dimension. The method of the present invention achieves narrow emitter dimension (in the present application the terms emitter dimension and emitter width are interchangeably used; for the sake of clarity the remaining portions of the application will only use the term emitter width) without the need of advanced lithographic tools and/or advanced photomasks such as phase shift masks. Another advantage of the method of the present invention is that it has fewer processing steps as compared with prior art self-aligned processes.

One aspect of the present invention is directed to a method of fabricating a high-performance, raised extrinsic base HBT having a narrow emitter width that includes the steps of:

providing a structure comprising a patterned nitride pedestal region which exposes a portion of an underlying base region;

forming a stack comprises at least a bottom doped semiconducting layer on the exposed portion of the base region;

selectively removing the patterned nitride pedestal region to provide an opening for an emitter having a first width;

forming inner spacers in the opening to provide a second width that is less than the first width; and forming an emitter in the opening.

In the present invention, the base region includes a monocrystalline region that is surrounded on either side by adjoining polycrystalline regions. The monocrystalline region is formed atop a Si substrate, whereas the polycrystalline regions are located atop trench isolation regions that are located in the Si substrate.

DETAILED DESCRIPTION

Figure 1:
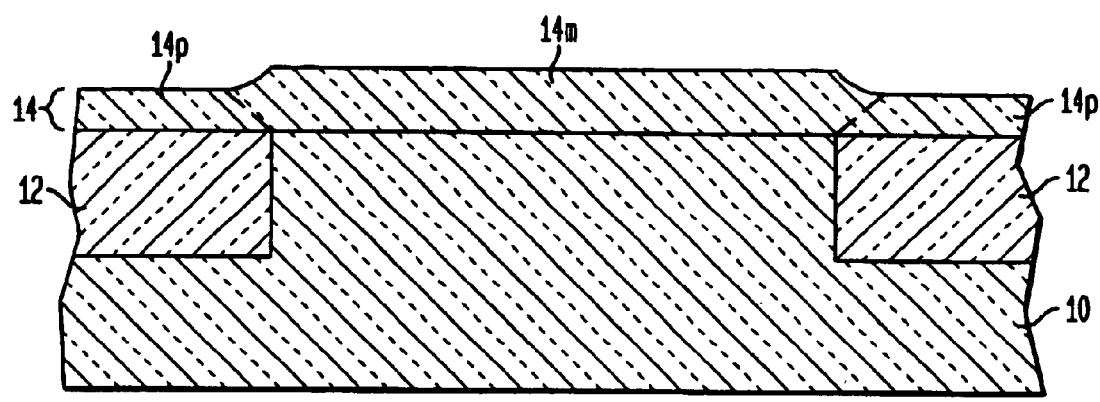
FIGS. 1–7 are pictorial representations (through cross sectional views) illustrating the basic processing steps that are employed in the present invention in forming a high-performance, raised extrinsic base HBT having a narrow emitter width.

The present invention, which provides a method for fabricating a high-performance bipolar transistor in which a nitride pedestal and inner spacers are used to reduce the width of the emitter, will now be described in greater detail by referring to the drawings that accompany the present application. The drawings of the present application are directed to the HBT device area emphasizing the use of a nitride pedestal and inner spacers to reduce emitter dimension. For simplicity, other areas of a typically bipolar transistor structure are not shown in the drawings of the present application. It is also worth mentioning that despite showing a single HBT device area, the present invention works equally well when a plurality of HBT device areas are present on the Si substrate.

FIG. 1 shows an initial structure of the present invention. The initial structure includes a Si substrate 10 having trench isolation regions 12 formed therein. The Si substrate 10 may be a Si-containing semiconductor structure such as Si, SiGe, SiC, SiGeC or a silicon-on-insulator. Alternatively, the Si substrate 10 may be a Si layer such as epi-Si formed atop of a semiconductor substrate. The Si substrate 10 may include various doping or well regions formed therein. Moreover, the Si substrate 10 may include a sub-collector region and a collector region formed therein. For simplicity, the drawings do not specifically shown either the collector or subcollector.

The trench isolation regions 12 that are located in the Si substrate 10 are made using conventional techniques that are well known to those skilled in the art including, for example, lithography, etching, trench filling, and planarization. The trench fill material includes a dielectric such as tetraethylorthosilicate (TEOS) or a high-density plasma TEOS.

The initial structure shown in FIG. 1 also includes a base region 14 located atop the Si substrate 10 as well as the trench isolation regions 12. The base region 14, which may also be referred to herein as the epitaxial base, is formed on exposed surfaces of the structure using a low temperature epitaxial growth process (typically 450Å°–700Å° C.). The base region 14, which may comprise Si, SiGe or a combination of Si and SiGe, is monocrystalline 14m on top of exposed portions of Si substrate 10 and polycrystalline 14p on top of the trench isolation regions 12. The region in which a change from monocrystalline to polycrystalline occurs is referred to in the art as the facet region (facet region is shown in the drawings by a dotted line). The base region 14 that is formed at this step of the present invention typically has a thickness after epitaxial growth of from about 100 to about 2000 Å☐

Figure 2:
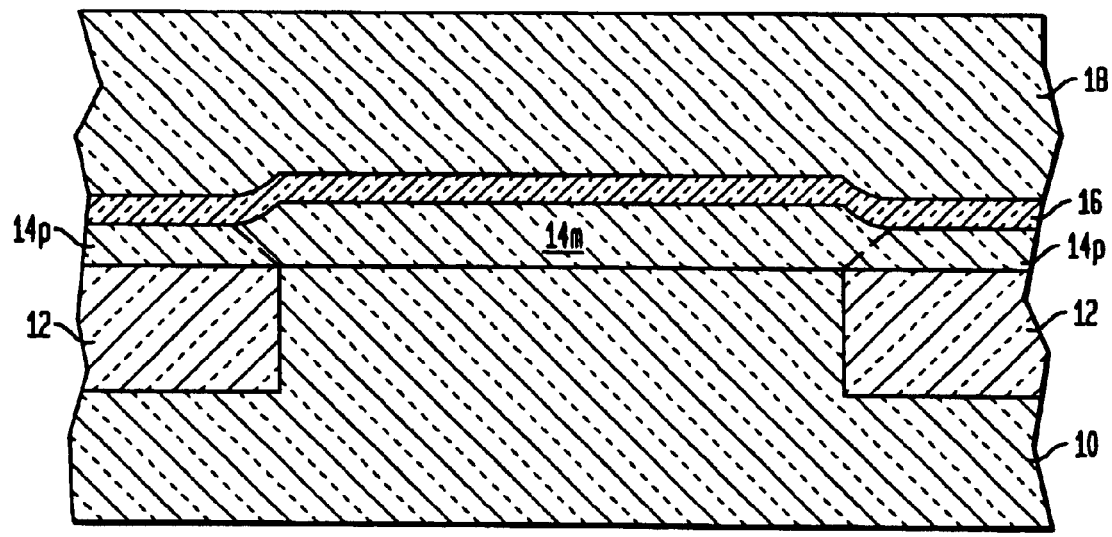

Next, an oxide layer 16 is formed atop the base region 14 using either an oxidation process or a conventional deposition process such as chemical vapor deposition (CVD). The oxide layer 16 has a thickness of from about 5 to about 20 nm. Next, a layer of nitride 18 such as silicon nitride is formed atop the oxide layer 16 utilizing a conventional deposition process such as CVD or PECVD (plasma enhanced chemical vapor deposition). The nitride layer 18 has a thickness of from about 50 to about 300 nm, preferably 150 to 250 nm. The resultant structure including the oxide layer 16 and the nitride layer 18 is shown, for example, in FIG. 2.

The nitride layer 18 is then patterned by lithography and etching to open the area where the raised extrinsic base is to be formed, and to provide at least a patterned nitride pedestal region 20 which is located above a portion of the monocrystalline region 14m of the base region 14. The other areas of nitride, other than the nitride pedestal region, remaining after etching are denoted by 18 in FIG. 3. The other areas together with the nitride pedestal region will serve as a CMP stopping layer in the subsequent processing steps of the present invention. The lithography step includes providing a photoresist (not shown) atop the nitride layer 18, exposing the photoresist to a pattern of radiation and developing the pattern into the photoresist.

Figure 3:
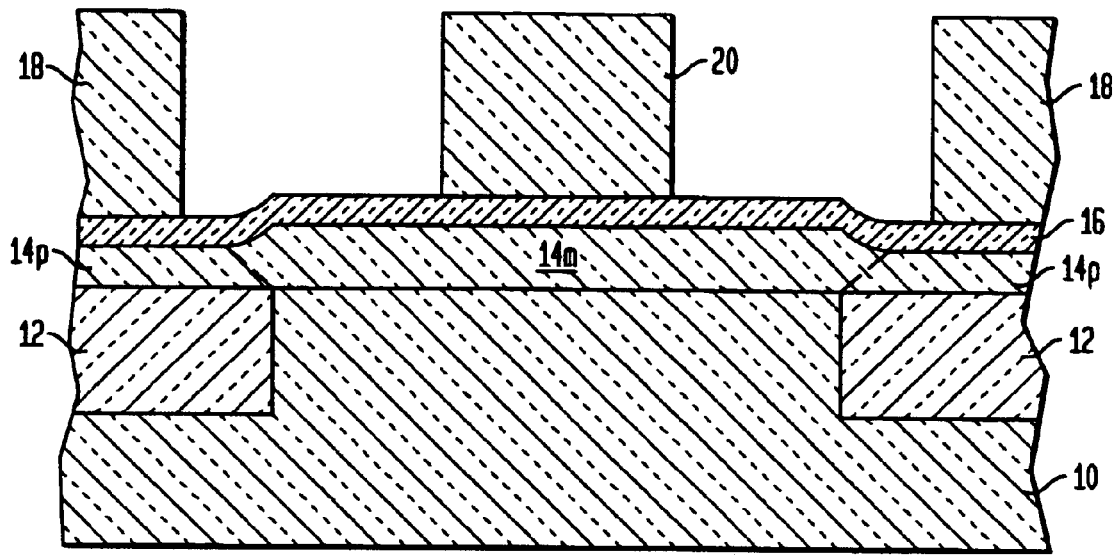

The etching used in forming the patterned nitride pedestal region 20 includes a dry etching process such as reactive ion etching (RIE) that is capable of forming substantially vertical sidewalls in the nitride layer 18, yet stops on oxide with good selectivity. The patterned photoresist mask is generally removed after etching utilizing a conventional stripping process. The resultant structure after patterning and etching is shown, for example, in FIG. 3. As shown in FIG. 3, the patterning and etching steps expose portions of the oxide layer 16, while protecting other portions of the oxide layer 16 with nitride.

In some embodiments of the present invention, a hard mask (not shown) may be used in patterning the nitride layer 18. When a hard mask is used it is formed atop the nitride layer 18 prior to patterning and it may be removed from the structure during a subsequent removal step of the present invention. One example of a hard mask that may be employed in the present invention is polycrystalline Si.

Following formation of the patterned nitride pedestal region 20 atop a portion of the monocrystalline region 14m of the base region 14, the exposed portions of the oxide layer 16, not protected by nitride, are removed utilizing an etching process that is highly selective for removing oxide as compared with nitride or silicon. This etching step thus stops atop base region 14. A doped semiconducting layer 22 such as polycrystalline or single crystalline Si or SiGe (hereinafter doped layer 22) is formed on the now exposed portions of the base region 14 that lie adjacent to the patterned nitride pedestal region 20 as well as atop portions of the patterned nitride pedestal region 20 and nitride 18. The doped layer 22 can be a layer with a variable doping concentration, or Ge composition that can be grown in a CVD system. The doped layer 22 may also be formed by either an in-situ doped deposition process or by first depositing a Si (either polycrystalline or single crystalline) or SiGe layer and then doping by ion implantation and annealing. The doping by implant typically occurs after the CMP and recess steps, which are described in greater detail herein below. In a preferred embodiment of the present invention, an in-situ doping deposition process is utilized. The doped layer 22 typically has a thickness, prior to CMP and recessing, of from about 100 to about 400 nm, and is thicker than the nitride pedestal layer 20.

Following formation of the doped layer 22, a planarization processing step such as chemical mechanical polishing (CMP) may be employed to provide a structure in which the doped layer 22 is substantially coplanar with an upper surface of the patterned nitride pedestal region 20.

Following formation of the doped layer 22 and planarization, the doped layer 22 is recessed utilizing a timed RIE process such that the upper surface of the doped layer 22 is lower than the upper surface of the patterned nitride pedestal region 20.

Figure 4:
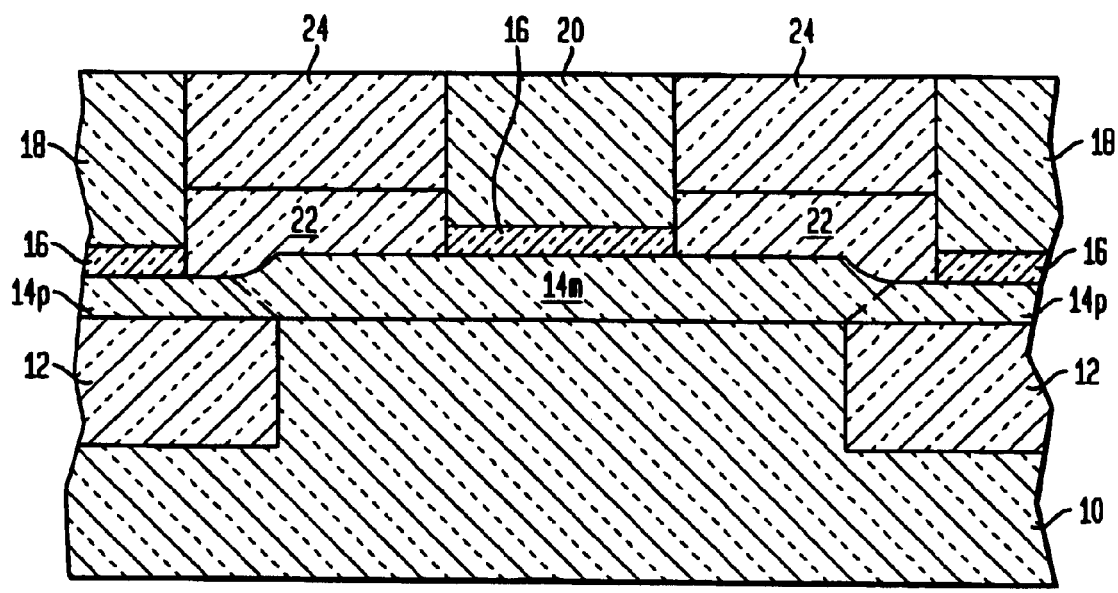

The area above the recessed doped layer 22 is then filled with an insulating dielectric material 24 such as an oxide utilizing a deposition process such as CVD or plasma-assisted CVD. The insulating dielectric material 24 is then planarized to the upper surface of the patterned nitride pedestal region 20 utilizing CMP. The resultant structure including a stack of recessed doped layer 22 and the insulating dielectric material 24 located atop the base region 14 that lies adjacent to the patterned nitride pedestal region 20 is shown, for example, in FIG. 4. The recessed doped layer 22 has a typical thickness of from about 20 nm to about 100 nm, preferably from about 50 to about 100 nm, and the insulating dielectric has a typical thickness of from about 20 to about 150 nm, preferably from about 50 to about 100 nm.

Alternatively, the doped layer 22 can be deposited using selective epitaxy of Si or SiGe; the doped layer 22 can be in-situ doped during deposition or using ion implantation and annealing after the deposition. With selective epitaxy, the CMP and recess steps are not required. The insulating layer 24 can be processed using the above method, or using an oxidation process that requires a low thermal cycle, such as high-pressure oxidation (HIPOX) or steam oxidation.

Figure 5:
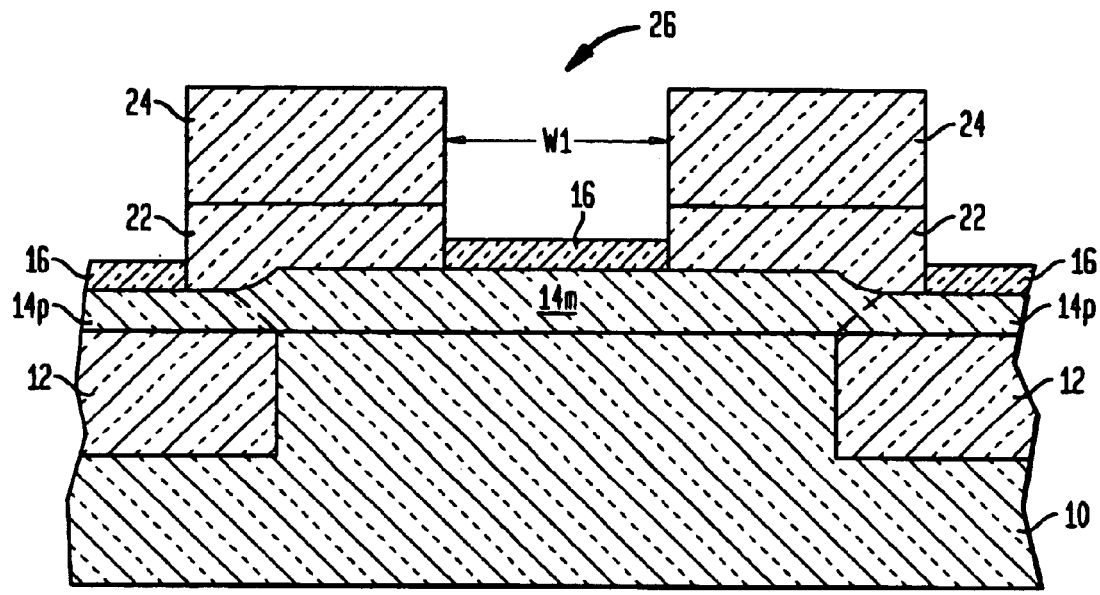

FIG. 5 shows the structure that is formed after removing the patterned nitride pedestal region 20 as well as any other regions of patterned nitride 18 from the structure. The areas of exposed nitride are removed utilizing an etching process that is selective for removing nitride as compared to oxide and Si. Examples of etching that can be used in this step of the present invention include, but are not limited to: hot phosphoric acid or RIE. As shown in FIG. 5, the etching stops atop the oxide layer 16 and an emitter opening 26 having a first width W1 is formed in the area previously occupied by the patterned nitride pedestal region 20.

Figure 6:
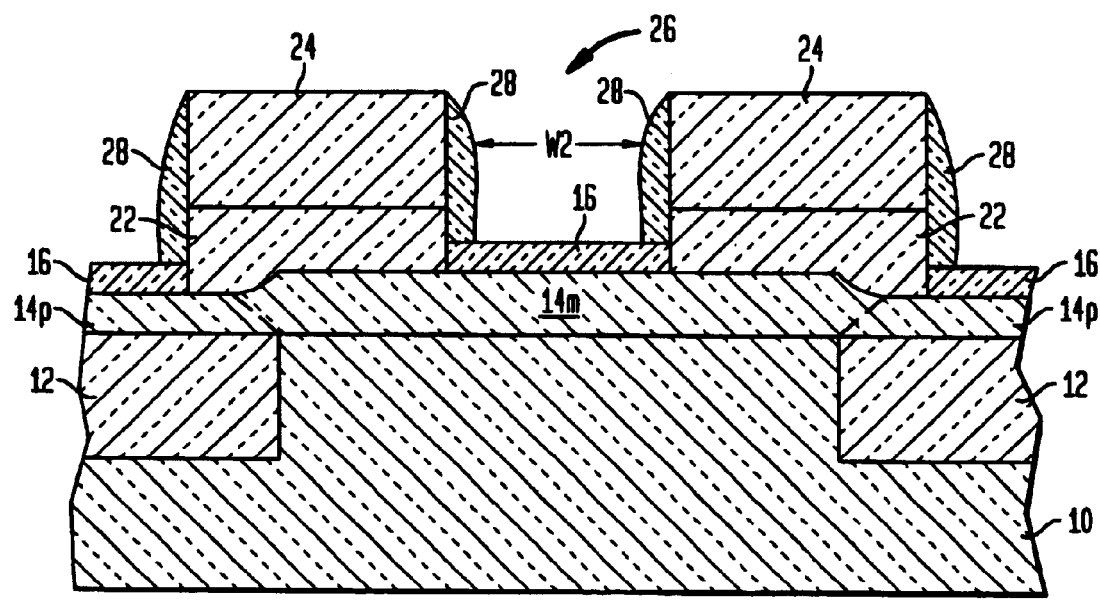

Next, and as shown in FIG. 6, inner spacers 28 are formed on a surface region of the exposed portions of the oxide layer 16 in at least the emitter opening 26 by deposition and etching. The inner spacers 28 are typically composed of a nitride. The inner spacers 28 typically have a thickness of from about 10 to about 100 nm, more preferably from about 20 to about 50 nm, and are used to provide a second width W2 that is less than W1. In addition to decreasing the dimension of the emitter, the inner spacers 28 also serve as a means for separating the emitter and extrinsic base. In the present invention, the inner spacers 28 can be used to reduce the emitter width by as much as 50%. An emitter width on the order of about 50 to about 250 nm is typically provided using the method of the present invention.

Next, the exposed oxide layer 16 is removed from the structure so as to at least expose a surface portion of the underlying monocrystalline region 14m of the base region 14. The exposed portions of oxide layer 16 are removed utilizing a chemical oxide removal (COR) process or similar process that has similar etch rate for the oxide layer 16 compared with the insulating layer 24, or a higher etch rate for the oxide layer 16 as compared with the insulating layer 24. In the COR process, a gaseous mixture of HF and ammonia is employed. The ratio of HF to ammonia employed in the COR process is typically from 1:10 to 10:1, with a ratio of 2:1 being more highly preferred. Moreover, the COR process employed in the present invention is performed at a pressure between about 1 mTorr to about 100 mTorr and at a temperature of about 25° C.

After the COR process, an emitter 30 comprised of polycrystalline or single crystal silicon is deposited. Specifically, the emitter 30 is a doped silicon material that can be formed utilizing an in-situ doped deposition process or intrinsic deposition, followed by ion implantation and annealing. Note that the emitter 30 is in contact with the monocrystalline region 14m of the base region 14. It is also noted that the doping of the emitter 30, the base 14 and the collector can be tailored to provide either an npn or a pnp HBT, with preference given herein to npn HBT transistors.

Figure 7:
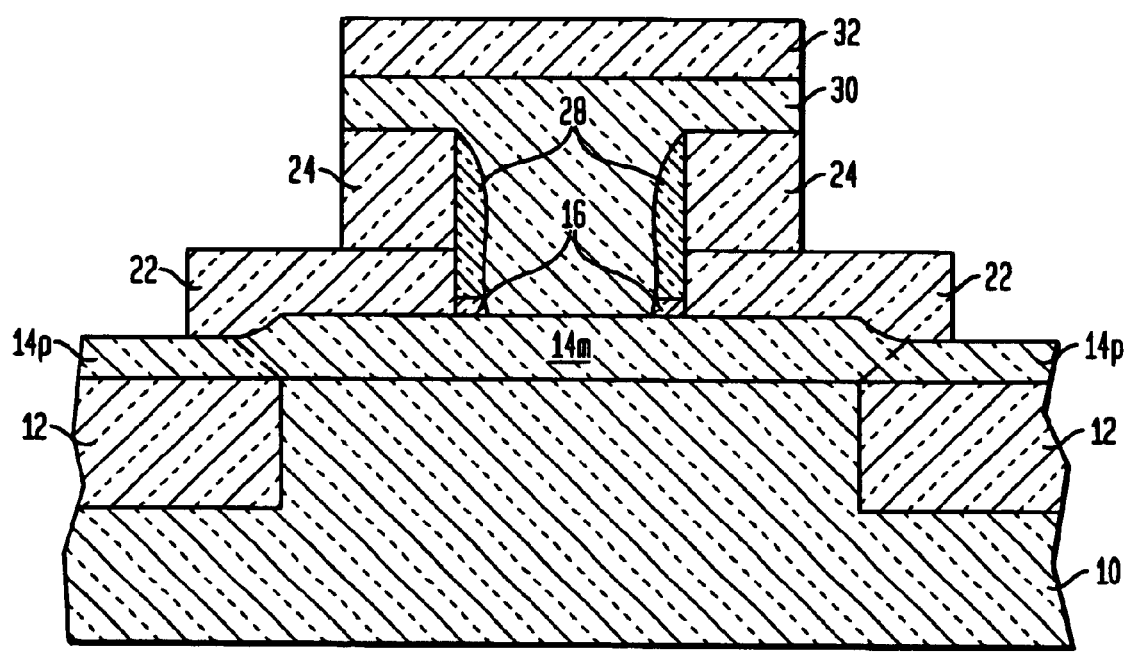

After emitter deposition, a hard mask 32 composed of a nitride is formed atop the emitter 30 by deposition, lithography and etching. The polysilicon 30, not protected with hard mask 32, is then removed utilizing a RIE process and the exposed insulating layer 24 is then removed by a dry etch or wet etch process providing the structure shown, for example, in FIG. 7. Silicide can then be formed and contact can then be made to the emitter, extrinsic base and collector. The collector contact, which is not shown in the drawings, typically includes a collector reach through which is in contact with the subcollector.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for forming a high-performance heterojunction bipolar transistor comprising the steps of:
    providing a structure comprising a patterned nitride pedestal region which exposes a portion of an underlying base region;
    forming a stack comprises at least a bottom doped semiconducting layer on the exposed portion of the base region;
    selectively removing the patterned nitride pedestal region to provide an opening for an emitter having a first width;
    forming an inner spacers in the opening to provide a second width that is less than the first width; and
    forming an emitter in the opening, wherein said emitter is in contact with said inner spacer, said bottom doped semiconductor layer is in contact with said inner spacer, and said emitter and said bottom doped semiconductor layer are separated from each other by said inner spacer.

2. The method of claim 1 wherein the stack further comprises an insulating dielectric material atop said doped semiconducting layer.

3. The method of claim 2 wherein the stack is formed by the steps of forming a doped semiconducting layer; planarizing the doped semiconductor layer stopping on nitride, recessing the doped semiconducting layer; and forming an insulating dielectric material on the recessed doped layer.

4. The method of claim 3 wherein the insulating dielectric material is formed by the steps of depositing a dielectric film; and planarizing the dielectric film stopping on nitride.

5. The method of claim 3 wherein the insulating dielectric material is formed by thermal oxidation of the doped semiconducting layer.

6. The method of claim 2 wherein the stack is formed by the steps of forming a doped semiconducting layer by selective epitaxy; and forming an insulating dielectric material on the doped semiconducting layer.

7. The method of claim 6 wherein the insulating dielectric material is formed by the steps of depositing a dielectric film; and planarizing the dielectric film stopping on nitride.

8. The method of claim 6 wherein the insulating dielectric material is formed by thermal oxidation of the doped semiconducting layer.

9. The method of claim 1 wherein the base region is located on a Si substrate having isolation regions formed therein wherein a monocrystalline region is located atop the Si substrate and polycrystalline regions are located atop the trench isolation regions.

10. The method of claim 1 wherein said structure further comprises an oxide layer between the patterned nitride pedestal region and the underlying base region.

11. The method of claim 1 wherein the patterned nitride pedestal region is formed by the steps of depositing a nitride layer atop an oxide layer that is located atop the base region; and subjecting the nitride layer to lithography and etching.

12. The method of claim 11 wherein polycrystalline Si is used as a hard mask for nitride etching.

13. The method of claim 11 where the nitride layer is patterned so that only areas to form a raised extrinsic base are etched, and the remaining nitride layer is used as a stopping layer for chemical mechanical polishing.

14. The method of claim 11 wherein portions of the oxide layer not protected by the patterned nitride pedestal region are removed by an etching process that is highly selective in removing oxide as compared with nitride or polysilicon.

15. The method of claim 1 wherein the inner spacers comprises a nitride.

16. The method of claim 1 wherein the forming an emitter in the opening comprises a step wherein an oxide separating layer located atop the base region is removed by a chemical oxide removal step.

17. The method of claim 1 wherein forming of the emitter comprises depositing a doped silicon layer and patterning the doped silicon layer.

18. The method of claim 1 where the doped semiconducting layer is Si or SiGe.

19. The method of claim 1 where the doped semiconducting layer is in-situ doped during deposition.

20. The method of claim 1 where the doped semiconducting layer is doped by ion implant and anneal following the layer formation.

* * * * *